(12) United States Patent
Hara

(10) Patent No.: US 7,102,727 B2
(45) Date of Patent: Sep. 5, 2006

(54) OPTICAL SYSTEM FOR USE IN EXPOSURE APPARATUS AND DEVICE MANUFACTURING METHOD USING THE SAME

(75) Inventor: Shinichi Hara, Yokohama (JP)

(73) Assignee: Canon Kabushiki Kaisha, Tokyo (JP)

(*) Notice: Subject to any disclaimer, the term of this patent is extended or adjusted under 35 U.S.C. 154(b) by 147 days.

(21) Appl. No.: 10/799,196

(22) Filed: Mar. 12, 2004

(65) Prior Publication Data
US 2004/0227914 A1    Nov. 18, 2004

(30) Foreign Application Priority Data
Mar. 14, 2003   (JP)   ............................. 2003-070036

(51) Int. Cl.
*G03B 27/42*   (2006.01)
(52) U.S. Cl. .............................. 355/30; 355/53; 355/67
(58) Field of Classification Search .................... None
See application file for complete search history.

(56) References Cited

U.S. PATENT DOCUMENTS

| 5,390,228 | A | * | 2/1995 | Niibe et al. | .................. 378/34 |
| 5,544,213 | A | | 8/1996 | Chiba et al. | .................. 378/34 |
| 5,805,273 | A | * | 9/1998 | Unno | .......................... 355/30 |
| 2003/0235682 | A1 | * | 12/2003 | Sogard | ........................ 355/30 |

FOREIGN PATENT DOCUMENTS

| JP | 5-291117 | 11/1993 |
| JP | 7-153663 | 6/1995 |
| JP | 2000-286191 | 10/2000 |

* cited by examiner

*Primary Examiner*—D. Rutledge
(74) *Attorney, Agent, or Firm*—Morgan & Finnegan, LLP

(57) ABSTRACT

Disclosed is an optical system for directing light from a light source to a predetermined plane, and it includes an optical element, a measuring mechanism for performing position measurement to a surface of the optical element, at plural measurement points on that surface, a first temperature controlling mechanism for controlling temperature of a first control region of the optical element, a second temperature controlling mechanism for controlling temperature of a second control region of the optical element, and a temperature controller for controlling the first and second temperature controlling mechanisms on the basis of the measurement made by the measuring mechanism. The proposed structure is very effective to prevent thermal deformation of the optical element due to irradiation with light, particularly in a case where only a portion of the optical element is locally irradiated with light.

25 Claims, 5 Drawing Sheets

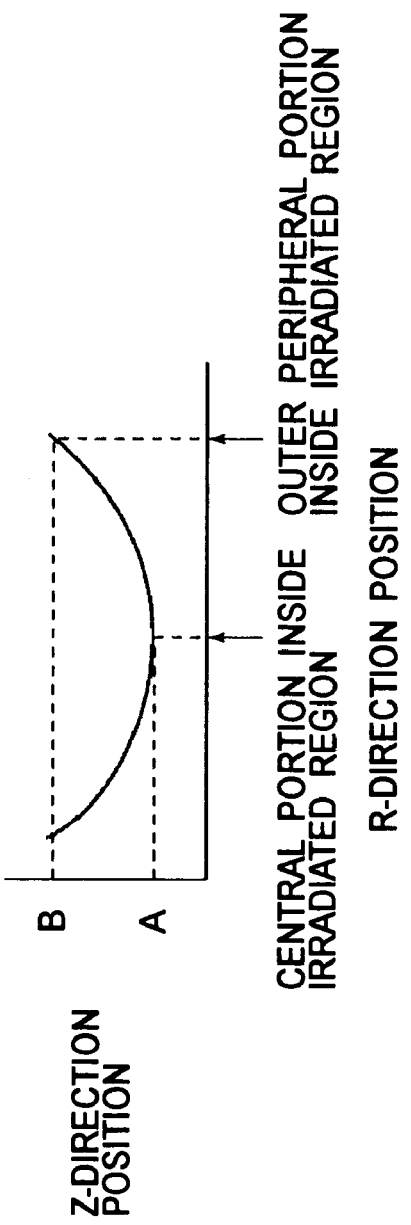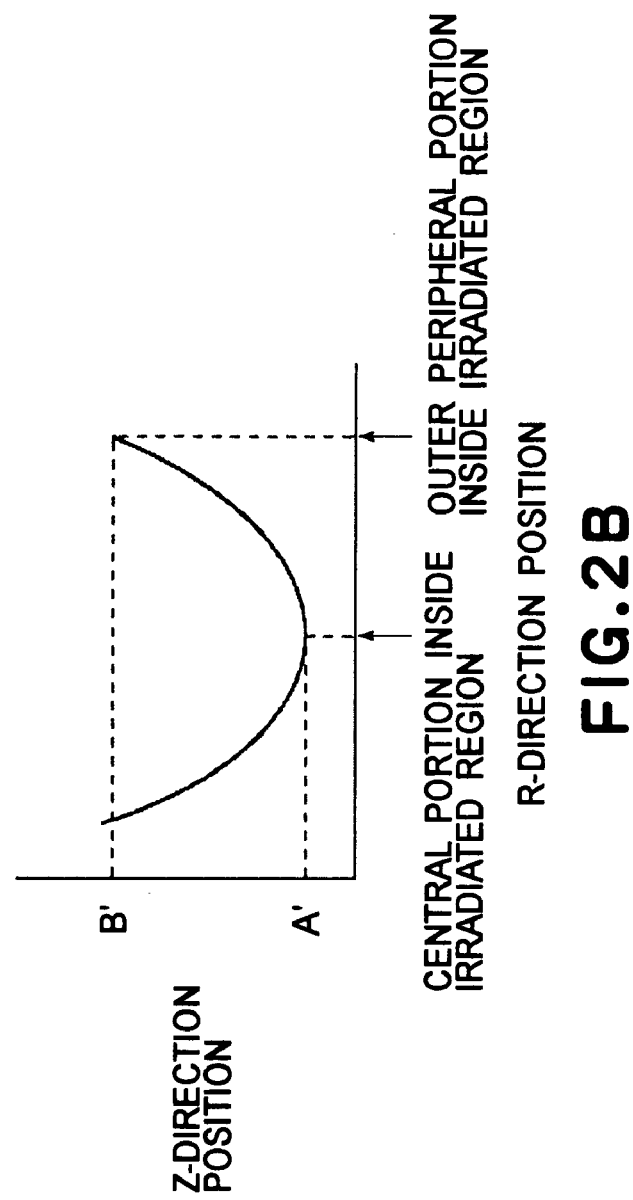

OPTICAL SYSTEM FOR USE IN EXPOSURE APPARATUS AND DEVICE MANUFACTURING METHOD USING THE SAME

FIELD OF THE INVENTION AND RELATED ART

This invention relates generally to a mirror holding device and, more particularly, to an exposure apparatus for exposing a workpiece such as a monocrystal substrate for semiconductor wafer or a glass substrate for liquid crystal display (LCD), for example. The present invention is particularly suitably applicable to exposure apparatuses using ultraviolet light or extreme ultraviolet (EUV) light, as an exposure light source.

Production of microdevices such as semiconductor devices (e.g. semiconductor memories or logic circuits) based on photolithography (printing) technology conventionally uses a reduction projection exposure apparatus in which a circuit pattern formed on a reticle or a mask (these terms will be used interchangeably in this specification) is projected by a projection optical system onto a wafer or the like so that the circuit pattern is transferred thereto.

The smallest size (resolution) that can be transferred to a reduction projection exposure apparatus is proportional to the wavelength of light used for the exposure, and it is inversely proportional to the numerical aperture (NA) of the projection optical system. Thus, the shorter the wavelength is, the better the resolution is. For this reason, in order to meet recent requirements to further miniaturization of semiconductor devices, the wavelength of used exposure light has been shortened more and more. Practically, the wavelength of used ultraviolet light has been shortened in the way from ultra-high pressure Hg lamp (i-line of a wavelength of about 365 nm) to KrF excimer laser (wavelength of about 248 nm) and then to ArF excimer laser (wavelength of about 193 nm).

Since, however, the size of semiconductor devices has been decreased considerably, there is a limitation in the lithography using ultraviolet light. Thus, in order to enable efficient transfer of a very fine circuit pattern of 0.1 micron or narrower, a reduction projection exposure apparatus that uses extreme ultraviolet (EUV) light of a wavelength of about 10 nm to 15 nm, shorter than the ultraviolet light, has been developed (hereinafter, such apparatus will be referred to as "EUV exposure apparatus").

As the wavelength of exposure light becomes very short, absorption of light by a substance becomes very large. Therefore, it becomes difficult to use a refractive optical element based on refraction of light (i.e. lens) that can be used with visible light or ultraviolet light. Further, in the wavelength region of EUV light, inherently there is no usable glass material present and, therefore, a catoptric system in which an optical system is constituted only by reflective optical elements based on reflection of light (i.e. mirrors such as multilayered film mirrors) is used.

Generally, a mirror does not reflect all of exposure light, but it absorbs 30% or more of exposure light. The absorbed exposure light produces heat that may cause deformation of the surface shape of the mirror, resulting in degradation of optical performance (particularly imaging performance) thereof. Therefore, in order to suppress deformation of the mirror shape due to temperature variation, a mirror is made of a low thermal-expansion glass material having a small linear expansion coefficient such as 10 ppb, for example.

EUV exposure apparatuses are used for exposure of a circuit pattern having a linewidth of 0.1 μm or narrower and, therefore, the linewidth precision is extraordinarily strict. As regards the mirror surface shape, only deformation of about 0.1 nm will be accepted. If, therefore, the mirror has a linear expansion coefficient of 20 ppb, the temperature thereof will rise gradually due to absorption of exposure light, and the shape of the mirror surface will be changed thereby. If the mirror has a thickness 50 mm, a temperature rise of 0.1° C. will cause deformation of mirror surface shape by an amount 0.1 nm.

Japanese Laid-Open Patent Application No. H05-291117 shows a projection exposure apparatus in which the heat quantity applied to a mirror is kept constant to thereby maintain the mirror shape constant.

Japanese Laid-Open Patent Application No. 2000-286191 proposes means for correcting the surface shape of a deformed mirror, by correcting the bottom surface of the mirror with use of plural pins.

In the exposure apparatus shown in Japanese Laid-Open Patent Application No. H05-291117, the heat quantity applied to the mirror is not always constant during the exposure. Since the heat quantity is different with patterns, it is practically difficult to stably maintain the heat quantity applied to the mirror constant. Further, even though the heat quantity applied to the mirror can be kept constant, if the location whereat the heat quantity is applied is different or a distribution of the heat quantity application is different, the mirror will be deformed in a different way. Thus, keeping the heat quantity constant does not always assure a constant mirror shape.

In the exposure apparatus shown in Japanese Laid-Open Patent Application No. 2000-286191, if the positional stability of the correction driving pins is poor as more than 0.1 nm, the mirror surface will be deformed to cause undesirable aberration thereof.

SUMMARY OF THE INVENTION

It is accordingly an object of the present invention to provide an optical system and/or an exposure apparatus by which deformation of a mirror due to thermal expansion thereof, which otherwise might cause degradation of the imaging performance, can be reduced effectively to thereby assure desired optical performance.

In accordance with an aspect of the present invention, there is provided an optical system for directing light from a light source to a predetermined plane, comprising: at least one optical element disposed in an inside space of said optical system; a measuring mechanism for measuring a surface shape of the at least one optical element; and a temperature controller for controlling a temperature of the at least one optical element on the basis of the measurement made by said measuring mechanism.

In accordance with another aspect of the present invention, there is provided an optical system for directing light from a light source to a predetermined plane, comprising: an optical element; a measuring mechanism for performing position measurement to a surface of the optical element, at plural measurement points on that surface; a first temperature controlling mechanism for controlling temperature of a first control region of the optical element; a second temperature controlling mechanism for controlling temperature of a second control region of the optical element; and a temperature controller for controlling said first and second temperature controlling mechanisms on the basis of the measurement made by said measuring mechanism.

In accordance with a further aspect of the present invention, there is provided an exposure apparatus including an optical system as recited above.

In accordance with a still further aspect of the present invention, there is provided a device manufacturing method, comprising the steps of: exposing an object to be exposed, by use of an exposure apparatus as recited above; and developing the exposed object.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 2A and 2B are graphs for explaining changes in the shape of a mirror surface to be produced as a result of irradiation with exposure light.

DESCRIPTION OF THE PREFERRED EMBODIMENTS

Figure 1:
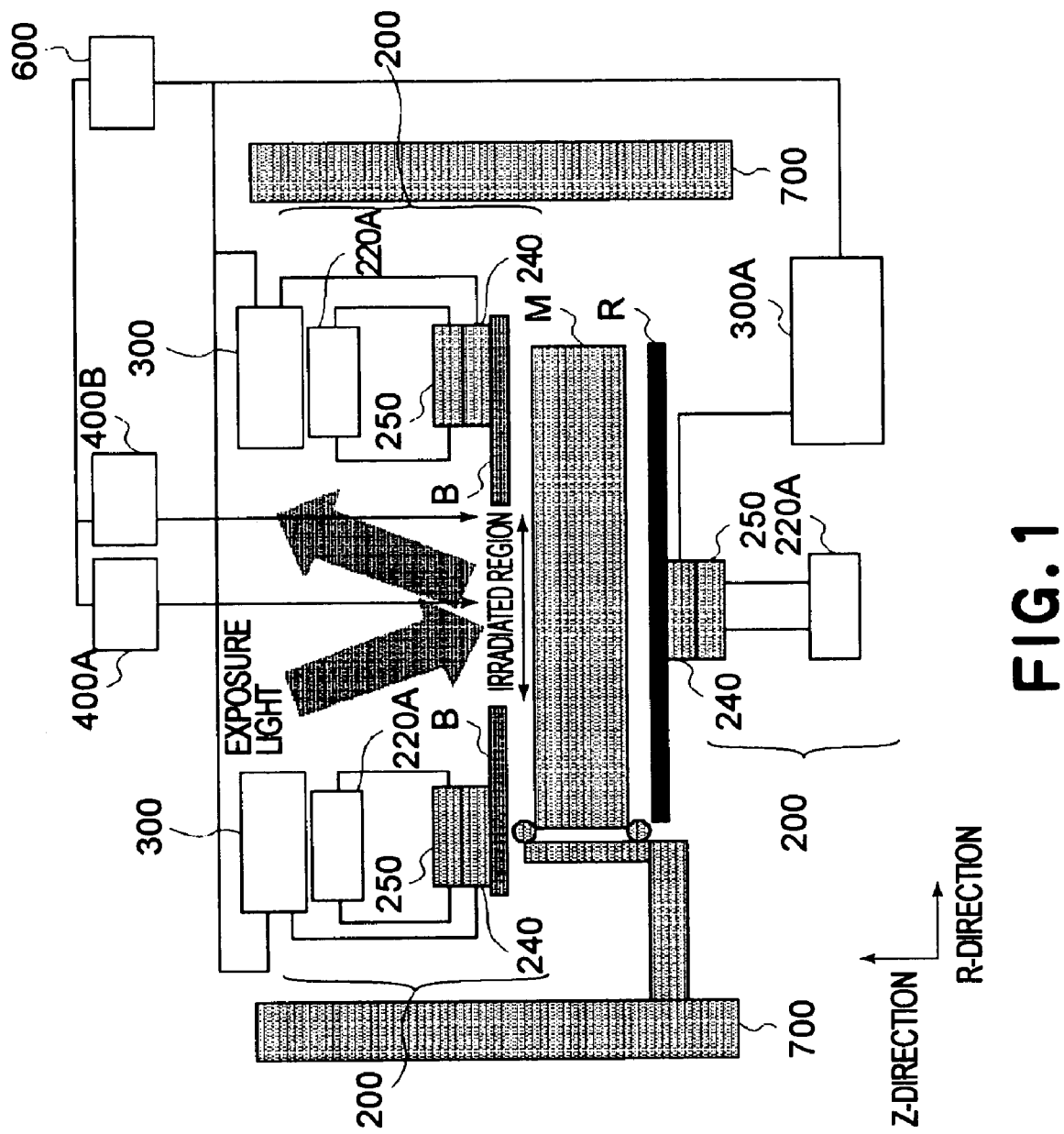
FIG. 1 is a schematic view of a general structure of an exposure apparatus according to an embodiment of the present invention.

Preferred embodiments of exposure apparatus according to the present invention will now be described with reference to the attached drawings. In these drawings, corresponding components are illustrated with corresponding reference numerals, and duplicate description therefor will be omitted.

Figure 3:
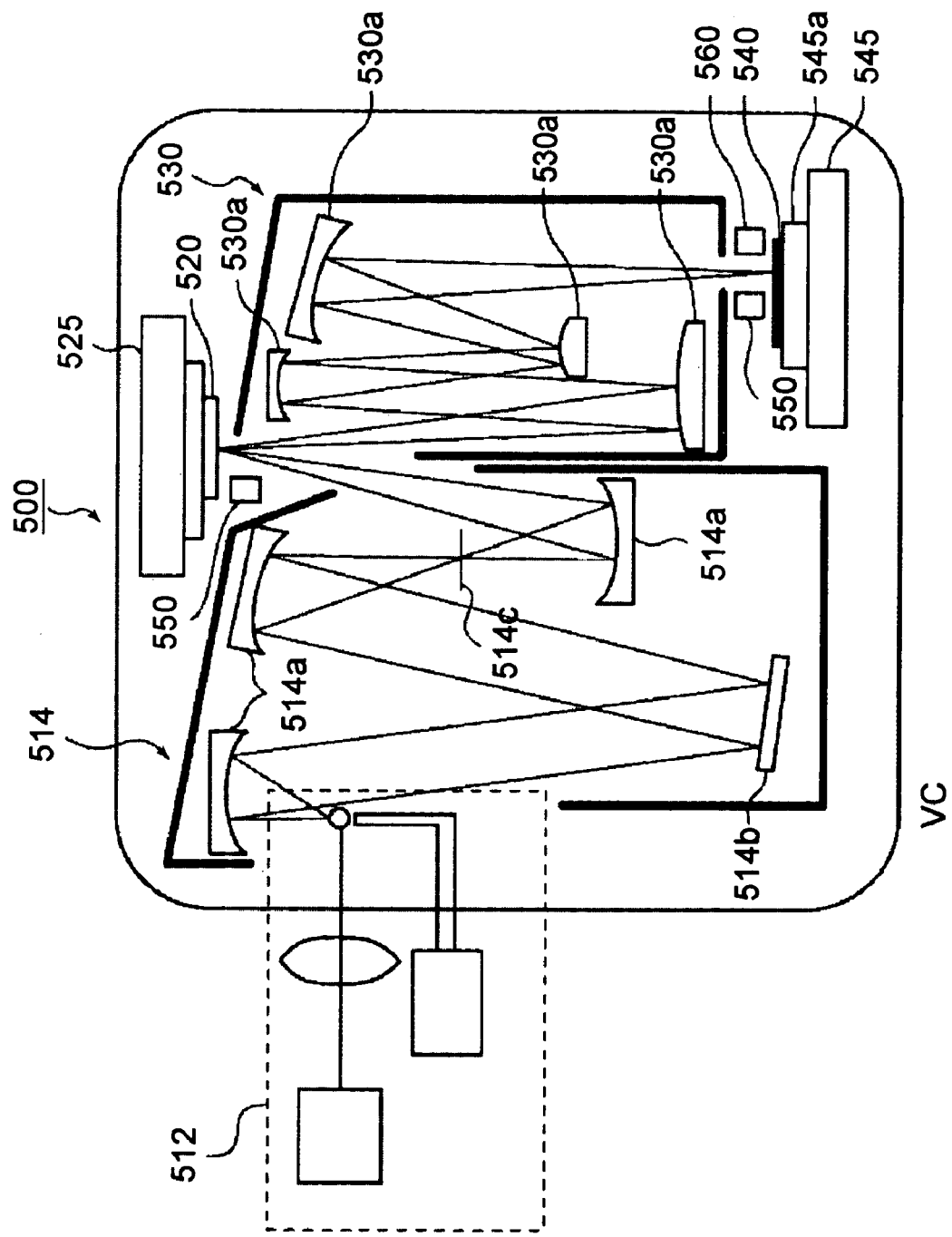
FIG. 3 is a schematic view of a main portion of a structure of an exposure apparatus according to an embodiment of the present invention.

FIG. 3 is a schematic view of a general structure of an exposure apparatus 500 according to an embodiment of the present invention.

The exposure apparatus 500 of the present invention is a projection exposure apparatus being arranged so that EUV light (e.g. a wavelength of 13.4 nm) is used as exposure light and a circuit pattern formed on a mask 520 is transferred to a workpiece 540 to be processed, in accordance with a step-and-scan method or a step-and-repeat method. Such exposure apparatus is particularly suitable for a lithographic process or submicron or quarter-micron order or narrower. This embodiment will be described with reference to an example of step-and-scan type exposure apparatus (called a "scanner"). Here, the step-and-scan method is an exposure method in which a wafer is continuously scanned (scanningly moved) relative to a mask by which a mask pattern is photoprinted on the wafer and, after exposure of a single shot is completed, the wafer is moved stepwise to place a subsequent exposure region. The step-and-repeat method is an exposure method in which the exposure of a single shot is carried out simultaneously.

Referring to FIG. 3, the exposure apparatus 500 comprises an illumination optical system 514 for illuminating a mask 520 with light from a light source device (EUV light source) 512, a mask stage 525 for carrying the mask 520 thereon, a projection optical system 530 for directing light from the mask 520 toward a workpiece to be processed, a wafer stage 545 for carrying the workpiece 540 thereon, an alignment detecting mechanism 550 and a focus position detecting mechanism 560.

The EUV light has low transmissivity to atmosphere, and contamination is easily produced due to reaction with any residual gas component such as high molecular organic gas, for example. In consideration of this, as shown in FIG. 3, the light path for the EUV light (i.e. the whole optical system) is maintained in a vacuum ambience VC. The vacuum ambience may be replaced by a reduced pressure ambience.

The illumination system is arranged to illuminate the mask 520 with EUV light of arcuate shape (having a wavelength 13.4 nm, for example) that corresponds to an arcuate-shape field of view of the projection optical system 530, and it comprises EUV light source 512 and illumination optical system 514.

The EUV light source 512 comprises a laser plasma light source, for example, in which large-intensity pulse laser is projected on a target material accommodated in a vacuum container, to produce high-temperature plasma. EUV light of a wavelength of about 13 nm, for example, is emitted from the plasma and it is used. As regards the target material, metal film, gas jet, liquid drop, for example, may be used. For increasing the average strength of emitted EUV light, the repetition frequency of the pulse laser may desirably be higher, and normally the laser is operated at a repetition frequency of a few kHz (preferably, 1 to 5 kHz).

The illumination optical system 514 comprises condensing mirrors 514a and an optical integrator 514b. The condensing mirrors 514a have a function for collecting EUV light having been emitted substantially isotropically from the laser plasma. The optical integrator 514b has a function for illuminating a predetermined region (approximately arcuate-shaped region) of the mask 520 substantially uniformly at a predetermined numerical aperture. The illumination optical system 514 has an aperture 514c disposed at a position conjugate with the mask 520, for restricting the illumination region on the mask 520 to an arcuate shape.

The mask 520 is a reflection type mask, and a circuit pattern (or image) to be transferred is formed thereon. The mask is supported on and is moved by the mask stage. Diffraction light produced by the mask 520 is reflected by the projection optical system 530 and is projected on the workpiece 540 to be processed. The mask 520 and the workpiece 540 are disposed in a substantially optically conjugate relation with each other. Since the exposure apparatus 500 is a step-and-scan type exposure apparatus, the mask 520 and the workpiece 540 are scanned in this embodiment, by which the pattern of the mask 520 is projected on the workpiece 540 in a reduced scale.

The mask stage 525 supports the mask 520, and it is connected to a moving mechanism (not shown). As regards the mask stage 525, any structure well known in the art may be applied. The unshown moving mechanism includes a linear motor, for example, and it functions to drive the mask stage 525 thereby to move the mask 520. In the exposure apparatus 500, the mask 520 and the workpiece 540 are scanningly moved in synchronism with each other, with the projection magnification being taken into account.

The projection optical system 530 serves to project a pattern formed on the mask 520 surface onto the workpiece 540 (corresponding to an image plane) in a reduced scale, by use of a plurality of mirrors (i.e. multilayered-film mirrors) 530a. The number of mirrors 530a is four, in FIG. 3. However, the number is not limited to this. It may be four, six or eight, and a number of about four to eight may be used. In order to accomplish a wide exposure region with a small number of mirrors, only a narrow arcuate region (ring field) spaced apart from the optical axis by a predetermined distance is used, while the mask 520 and the workpiece 540 are scanned simultaneously, so that a wide area is transferred. The projection optical system 530 has a numerical aperture (NA) of about 0.2 to 0.3.

Mirrors of the projection optical system and the illumination optical system are supported by a barrel 700 that partially encircles the mirrors.

The workpiece 540 is a wafer, in this embodiment, but it may be a liquid crystal substrate or any other substrate. The workpiece 540 is coated with a photoresist.

The wafer stage 545 supports the workpiece 540 through a wafer chuck 545a. The wafer stage 540 moves the workpiece 540 by use of a linear motor, for example. The mask 520 and the workpiece 540 are scanned in synchronism with each other. The positions of the mask stage 525 and the wafer stage 545 are monitored by use of a laser interferometer, for example, such that they are driven at a constant speed ratio.

The alignment detecting mechanism functions to measure the positional relation between the position of the mask 520 and the optical axis of the projection optical system 530 as well as the positional relation between the position of the workpiece 540 and the optical axis of the projection optical system 530. Also, it functions to set the positions and angles of the mask state 525 and the wafer stage 545 so that a projected image of the mask 520 is registered with a predetermined position on the workpiece 540.

The focus position detecting mechanism 560 functions to measure the focus position upon the workpiece 540 surface, and also it serves to control the position and angle of the wafer stage 545 such that, during the exposure, the workpiece 540 surface can be held at an imaging position defined by the projection optical system 530.

In exposure operation, the EUV light emitted from the illumination device 510 illuminates the mask 520, and the pattern formed on the mask 520 surface is imaged on the workpiece 540 surface. In this embodiment, the image plane has an arcuate shape (ring-like shape), and by scanning the mask 520 and the workpiece 540 at a speed ratio corresponding to the reduction magnification ratio, exposure of the whole surface of the mask 520 is carried out.

FIG. 1 illustrates the structure adjacent the condensing mirrors 514a or optical integrator 514b which are mirrors constituting the illumination optical system 514, or the mirrors 530a which are mirrors constituting the projection optical system 530.

Inside the vacuum chamber VC, a vacuum of about $1 \times 10^{-6}$ [Pa] is maintained by means of a vacuum pump (not shown), so as to prevent deposition of contamination on the surface of a mirror M due to reaction between a residual gas component and exposure light L, to thereby avoid resultant decrease of the reflectivity. An inactive gas may be introduced into the vacuum chamber and, in that occasion, an inactive gas such as helium or nitrogen may preferably be supplied thereinto.

Inside the vacuum chamber VC, the mirror M is supported by the barrel 700 and it is positioned at a predetermined place by means of a claming member MC and through a supporting member MB. On the basis of reflection, refraction or diffraction, for example, it functions to image the light. The element M is not limited to a mirror. It may be any other optical element such as, for example, a refractive lens, a parallel plane glass, a prism, or a diffractive optical element such as Fresnel zone plate, Kinoform, binary optics or hologram. This embodiment will be described with reference to an example using a mirror M.

As best seen in FIG. 1, disposed adjacent the mirror M are a barrel 700 that partially encircles the mirror, a member MB for supporting the mirror on the barrel, a mechanism MC for claming the mirror, and a cooling structure for controllably cooling the mirror in a predetermined temperature range. The cooling structure includes a mirror surface position detecting means (400A and 400B), a radiating mechanism 200, a radiating mechanism controlling means (300 and 300A), and a mirror surface shape controlling means 600. In this drawing, as a feature, only one mirror is illustrated as being partially encircled. As a matter of course, the invention is not limited to a case where only one mirror is provided inside the barrel, and a plurality of mirrors may be disposed inside the barrel. A radiating mechanism 200 or the like may be provided with respect to each of plural mirrors, or alternatively, a radiating mechanism 200 may be provided selectively in relation to one or more mirrors of the plural mirrors.

The mirror surface position detecting means performs position detection with respect to a plurality of points on the surface of a single mirror (which surface is a light reflecting surface and, if the element is not a mirror, it may of course be a surface that reflects and/or diffracts light). The structure may desirably be arranged so that, on the basis of the result of detection, the shape of the surface of the single mirror or the amount of change from the surface shape of the single mirror in its initial state (i.e. the surface shape of the mirror when the mirror as a whole is kept at a reference temperature or the surface shape of the mirror in a state in which the optical system does satisfy a desired optical performance) can be measured. Here, the mirror surface shape refers to the shape (profile) of the mirror with respect to at least one sectional plane thereof. The mirror surface shape does not necessarily mean three-dimensional surface shape of the whole mirror surface.

The mirror clamping mechanism MC serves to clamp the mirror approximately at three points, by use of pneumatic actuators such as air cylinders, for example. It is arranged to control the position and posture of each mirror, on the basis of the detection results applied from the aforementioned mirror surface shape controlling means 600, alignment detecting mechanism 550, focus position detecting mechanism 560 and a mechanism that detects aberration information or the like related to the projection optical system 530.

The supporting member MB for supporting the mirror on the barrel may have a structure similar to a kinematic mount disclosed in a mask holding method of Japanese Laid-Open Patent Application No. H07-153663, and it functions to confine the position of the mirror, supported at three points by the clamping mechanism MC, without excessive restriction in regard to all of six freedoms, thereby to hold the mirror position at a predetermined position.

The radiating mechanism 200 is disposed without contact to the mirror and without blocking the exposure light L. It serves to absorb heat from the mirror M, on the basis of radiation to the mirror M. The radiating mechanism may desirably be arranged so that a radiation plate disposed opposed to the mirror has a radiation coefficient not less than 0.8 while a radiation plate disposed not opposed to the mirror has a radiation coefficient not greater than 0.2, such that it does not apply a heat change to components other than the mirror.

The radiating mechanism 200 comprises radiation plates B and R, Peltier elements 240, heat radiating (dissipation) blocks 250, and circulating means 220A.

Each radiation plate B is joined to a Peltier element 240 to be described later. By means of the Peltier effect of the Peltier element 240, the radiation plate is cooled and the temperature thereof becomes low as compared with the mirror M, whereby a temperature difference is defined between them. Thus, on the basis of radiation, heat of the mirror M is absorbed by the radiation plate. On the other hand, the radiation plate R is joined to a Peltier element 240 to be described later. By means of the Peltier effect of the Peltier element 240, the radiation plate is heated and the temperature thereof becomes high as compared with the mirror M, whereby a temperature difference is produced therebetween. In this manner, on the basis of radiation, heat can be applied to the mirror M.

As regards the Peltier element 240 joined to the radiation plate B, by changing the electric current to be applied thereto, it can function to change the temperature difference to be defined between its heat absorbing surface (the surface in contact with the radiation plate B) and the heat radiating surface (the surface in contact with the heat radiating block 250). Furthermore, by keeping the heat radiating surface of the Peltier element at a constant temperature by use of a heat radiating block to be described later, the temperature of the heat absorbing surface thereof can be maintained at a constant temperature (temperature rise can be prevented). In this manner, from the radiation plate B joined with the heat absorbing surface of the Peltier element 240, heat of the mirror M can be absorbed and, thus, the mirror can be cooled.

Similarly, as regards the Peltier element 240 joined to the radiation plate R, by changing the electric current to be applied thereto, it can function to change the temperature difference to be defined between its heat absorbing surface (the surface in contact with the radiation plate R) and the heat radiating surface (the surface in contact with the heat radiating block 250). Furthermore, by keeping the heat absorbing surface of the Peltier element at a constant temperature by use of a heat radiating block to be described later, the temperature of the heat radiating surface thereof can be maintained at a constant temperature (temperature rise can be prevented).

Thus, by joining the heat radiating surface of the Peltier element 240 with the radiation plate R, heat can be radiated from the radiation plate R and, thus, the mirror can be heated thereby.

Because of good response of the Peltier element, the temperature of the radiation plates B and R can be controlled with good precision, and the mirror M can be held at a predetermined temperature.

If the heat capacity of the radiation plates B and R is too large, quick temperature control is unattainable despite the Peltier element has a good response. In consideration of this, in place of connecting the radiation plate B or R with the Peltier element at a single region, a plurality of Peltier elements may be used and they may be provided in contact with the radiation plate B or R at plural regions. Furthermore, different voltages may be applied to these Peltier elements so that a predetermined temperature distribution may be applied to the radiation plate B or R. For example, the temperature at the central portion of the radiation plate may be made low, while the temperature at the peripheral portion of the radiation plate may be made high as compared with the temperature at the central portion. Furthermore, by using the heat capacity of the radiation plate B or R, a particular temperature distribution may be produced in the radiation plate. More specifically, a temperature difference of 5° C. or more may be produced between the central portion and the peripheral portion of the radiation plate B or R.

The heat capacity of the radiation plates B and R may be made smaller than a predetermined value, such that the temperature of the radiation plate can change quickly. More specifically, in order that the temperature of the radiation plates B and R can change quickly, the specific heat of the radiation plate may preferably be not greater than 250 J/(kg·° C.) and the thermal conductivity thereof may preferably be not less than 50 W/(m·° C.).

Each heat radiating block 250 is joined to the heat radiating surface of a Peltier element 240, and it has a flowpassage for flow of heat medium (heat carrier) supplied from the circulating means 220A to be described later. The flowpassage is connected to the circulating means 220A through pipes. The flowpassage is formed in the heat radiating block, and it is so arranged that the heat medium can flow uniformly along the whole surface of the heat radiating block 250. Thus, the heat radiating block 250 can be maintained at a constant temperature by means of the heat medium.

The circulating means 220A is connected to the pipes through which the heat medium can be supplied into and circulated through the flowpassage of the heat radiating block 250. The heat medium supplied into and circulated through the flowpassage by the circulating means 220A, serves to collect heat from the heat radiating block 250 and to maintain the heat radiating block approximately at a constant temperature.

Next, a mechanism for suppressing deformation of a mirror will be described.

At a stage before the exposure light is incident, that is, at a stage before thermal distortion is produced in the mirror M, by using the measuring system 400A, a Z-axis position A of the mirror approximately at the center of an irradiation region to be irradiated with light is measured. Also, by using the measuring system 400B, a Z-axis position B of the mirror at the outer peripheral portion inside the irradiation region to be irradiated with light is measured. Then, a positional difference "A–B" is detected (see FIG. 2A). The direction Z (Z-axis) concerns a direction off the mirror surface, and the direction R concerns a direction along the mirror surface.

As the exposure light is incident, the temperature distribution of the mirror M changes, as described hereinbefore. The temperature distribution changes largely when the exposure is initiated from a state in which no exposure has been carried out, or when a wafer is replaced by a subsequent wafer and the latter is exposed.

The temperature distribution is produced such that the temperature at the irradiation region, irradiated with light, will rise as compared with the other portion, and deformation will be produced thereby. Thus, the Z-axis position A approximately at the center of the irradiation region shifts to a position A' while the Z-axis position B at the outer peripheral portion inside the irradiation region shifts to a position B' (see FIG. 2B). Since such deformation is caused mainly by simple bending deformation, the deformation can be reduced by positively applying a temperature difference to between the top (or front) and bottom (or rear) faces of the mirror to apply an opposite bending stress to the mirror. Here, the manner of applying an opposite bending stress is not limited to application of a temperature difference to between the top face side and the bottom face side of the mirror. A temperature difference may be applied to between two different points on the top (front) face side, thereby to produce a bending stress in the mirror. Alternatively, a temperature difference may be applied to between two different points on the bottom (rear) face side of the mirror to thereby produce a bending stress in the mirror.

This operation will be described in greater detail. The mirror surface shape controlling means 600 detects a positional difference "A–B" between the position A approximately at the center of the irradiation region and the position B of the outer peripheral portion inside the irradiation region, in the state (FIG. 2A state) in which, before exposure light is incident, no thermal deformation is produced. After the exposure light is incident, the radiating mechanism controlling means 300 is controlled so that a positional difference "A'–B'" between the position A' approximately at the center of the irradiation region and the position B' at the outer peripheral portion inside the irradiation region becomes approximately equal to the difference "A–B" having been detected as described above.

The radiating mechanism controlling means 300 controls the radiating mechanism 200. The controlling means 300A controls the temperature of the radiation plates B and R, by changing applied voltages to the Peltier elements 240.

Regarding the heat quantity as a substance Y having an absolute temperature $T_2$ [K] and an area $A_2$ [m$^2$] absorbs from a substance X having an absolute temperature $T_1$ [K] and an area $A_2$ [m$^2$] on the basis of radiation, where the radiation coefficient of the substance X is $E_1$, the radiation coefficient of the substance Y is $E_2$, and the radiation geometric factor (the rate of the energy impinging on the substance Y to the energy emerging from the substance X) is $F_{12}$, it can be expressed in terms of heat flux density Q [W/m$^2$] and by the following equation (where $T_1 > T_2$):

$$Q = 5.67 \times 10^{-8} \times (T_1^4 - T_2^4)/((1-E_1)/(E_1 \times A_1) + (1/(A_2 \times F_{12})) + (1-E_2)/(E_2 \times A_2))$$

where $5.67 \times 10^{-8}$ is Stefan-Boltzmann constant.

Namely, with a larger radiation geometric factor, with a larger area, or with a lager radiation coefficient, a larger amount of heat can be applied or deprived of on the basis of radiation.

By means of the radiating mechanism control, the radiation plate B can be controlled at a low temperature while the radiation plate R can be controlled at high temperature. As a result of this, on the basis of radiation described hereinbefore, the top face of the mirror M is cooled while the bottom face thereof is warmed. Consequently, bending deformation opposite to deformation resulting from exposure heat is produced, such that bending deformation attributable to the exposure heat can be reduced effectively.

The temperatures of the radiation plates B and R are so determined that the bending deformation becomes approximately equal to zero, that is, a relation A'–B'=A–B is satisfied.

Through the operation described above, deformation of a mirror resulting from absorption of exposure heat can be reduced. Therefore, degradation of aberration can be suppressed and, thus, an exposure apparatus by which a narrower linewidth, as compared with the conventional, can be transferred at a good precision is accomplished. The difference between the value of "A'–B'" and the value "A–B" may desirably be not greater than 0.3 nm, more preferably, not greater than 0.1 nm.

In accordance with this embodiment, since the surface shape of a mirror can be changed without contract to the mirror, there is no possibility of production of dust or particles due to friction or the like when the mirror surface shape is changed. As regards the particles (fine particles) to be produced, even if there is only a single particle of a size of about 50 nm produced, it is sufficient to cause a defect of circuit if the particle is adhered to the mirror surface, the mask or the wafer, and the yield is decreased thereby considerably.

Furthermore, since the structure according to this embodiment has an additional effect that the heat of the mirror can be absorbed by a radiation plate, the temperature of the mirror does not rise largely. As a result, the change in surface shape of the mirror due to the exposure heat can inherently be held small. Since the change in mirror surface shape is small, by correcting the small change in surface shape with a simple structure as described hereinbefore, mirror deformation can be reduced to substantially zero.

As regards the temperature variation of the radiation plate, where a Peltier element is used, it can be not greater than 0.01° C. In the structure of the present invention, in a case where A'–B'=–1 nm and A–B=0 nm, if the temperature of the radiation plate B is set at –10° C. with respect to the mirror temperature while the temperature of the radiation plate R is set at +40° C. with respect to the mirror temperature, then a relation A'–B'=A–B=0 nm can be accomplished. Namely, with a temperature difference of 50° C. between the radiation plates R and B, the surface shape of the mirror can be corrected by 1 nm. If the temperature of the radiation plate is controlled at 0.01° C. as described hereinbefore, theoretically the surface shape can be corrected at an extraordinarily high precision of 1 nm/(50/0.01). Practically, since the position measurement precision is not so high, the correction precision can not be high as such. However, it will be readily understood that the temperature stability of the radiation plate is sufficient in the present invention.

In the embodiment described above, the Z-axis positions at two locations, that is, the Z-axis position approximately at the center of the irradiation region on the mirror surface and the Z-axis position of the outer peripheral portion inside the irradiation region, are measured as representative points of the mirror surface shape. What is influential to the aberration of exposure is deformation of the irradiation region and, therefore, it is desirable to hold the Z-axis position of the irradiation region at a predetermined value. However, where the Z-axis position of the irradiation region can be predicted from Z-axis positions at two locations outside the irradiation region, the temperatures of the radiation plates B and R may be controlled so that the Z-axis positions at the two locations outside the irradiation region may take a desired value.

The present embodiment is not limited to the form described above. The irradiation region of a mirror to be irradiated with exposure light in an exposure apparatus is not always rotationally symmetrical. It may have an approximately oblong shape in a scan type exposure apparatus, for example, or any other non-rotationally symmetrical shape.

Where an irradiation region has a non-rotationally symmetrical shape, in regard to mutually different directions along the plane of the mirror M, the heat quantity distribution as the exposure light applies to the mirror M is different. If the heat amount distribution applied by the exposure light to the mirror M is different, naturally, the manner of deformation of the mirror M as well as the amount of deformation thereof will be different.

In consideration of this, a mirror position detecting means 400A may be disposed approximately at the center of the irradiation region and, additionally, a plurality of mirror position detecting means (including the detecting means 400B) may be provided at the outer peripheral portion inside the irradiation region, to measure deformation of the mirror with respect to different directions along the mirror plane. On the basis of the results of measurement, the temperature of the mirror may be controlled. For example, the radiation plate B may be divided into zones corresponding to the plural mirror position detecting means disposed at the outer peripheral portion inside the irradiation region, and temperatures of the thus divided zones of the radiation plate B may be controlled on the basis of the results of measurements, respectively. As a matter of course, it is not always necessary that the number of the mirror position detecting units disposed at the outer peripheral portion of the irradiation region is registered with the number of the divided zones of the radiation plate B. Furthermore, the radiation plate R may also be divided like the radiation plate B, and temperature control may be made to the divided zones, respectively.

In scan type exposure apparatuses, in many cases, the irradiation region of the mirror to be irradiated with light has an approximately oblong slit-like shape. In such case, there arises a notable difference in heat quantity distribution applied to the mirror, between the lengthwise direction and the widthwise direction of the slit. In consideration of this, mirror position detecting units may desirably be provided at three or more locations, that is, a position at the center of the irradiation region, a position shifted from the center of the irradiation region in the lengthwise direction of the slit (preferably, at the outer peripheral portion inside the irradiation region), and a position shifted from the center of the irradiation region in the widthwise direction of the slit (preferably, at the outer peripheral portion inside the irradiation region), wherein the positions may be five locations if the detecting means are provided at opposite ends of the shifted direction. In that occasion, the amount of mirror deformation may preferably be detected with respect to both of the lengthwise direction and the widthwise direction of the irradiation region of the mirror. Moreover, in that occasion, the radiation plate B (the radiation plate R may also be included) may be divided into at least four zones, with respect to the opposite ends of the slit lengthwise direction and the opposite ends of the slit widthwise direction, and the temperature control may be made to these divided zones independently. With such structure, it is possible to meet a case wherein a heat quantity distribution, a temperature distribution or a deformation amount, for example, is different between the lengthwise direction and the widthwise direction of the slit. Here, the lengthwise direction and the widthwise direction of the irradiation region may desirably be approximately perpendicular to each other, a small deviation may be acceptable (the amount of deviation or error from the mutually perpendicular state may preferably be not greater than about 10 deg.)

Here, as described above, it is not always necessary that the mirror position detecting means detects the mirror position inside the region to be irradiated with light. While the mirror position detecting means may detect the mirror position outside the irradiation region, preferably it may detect the mirror position with respect to at least two locations on the mirror (positions at least two locations on the mirror with respect to both of the lengthwise direction and the widthwise direction).

Furthermore, in addition to the control of mirror temperature as described above, the material of the mirror may be arranged specifically. For example, a glass ceramics material such as Zerodur (trade name) or ULE (trade name) has a low linear expansion coefficient. In this embodiment, in consideration of it, each mirror may desirably be made by use of a material having a linear expansion coefficient of not less than 0 ppb and not greater than 15 ppb, more preferably, not less than 5 ppb and not greater than 10 ppb. As a matter of course, what is formed by use of Zerodur (trade name) or ULE (trade name) is the substrate portion of the mirror. A multilayered film comprising Mo films and Si films may subsequently be formed on that substrate, to provide a reflection surface.

Next, referring to FIGS. 4 and 5, an embodiment of a device manufacturing method which uses an exposure apparatus 500 described above, will be explained.

Figure 4:
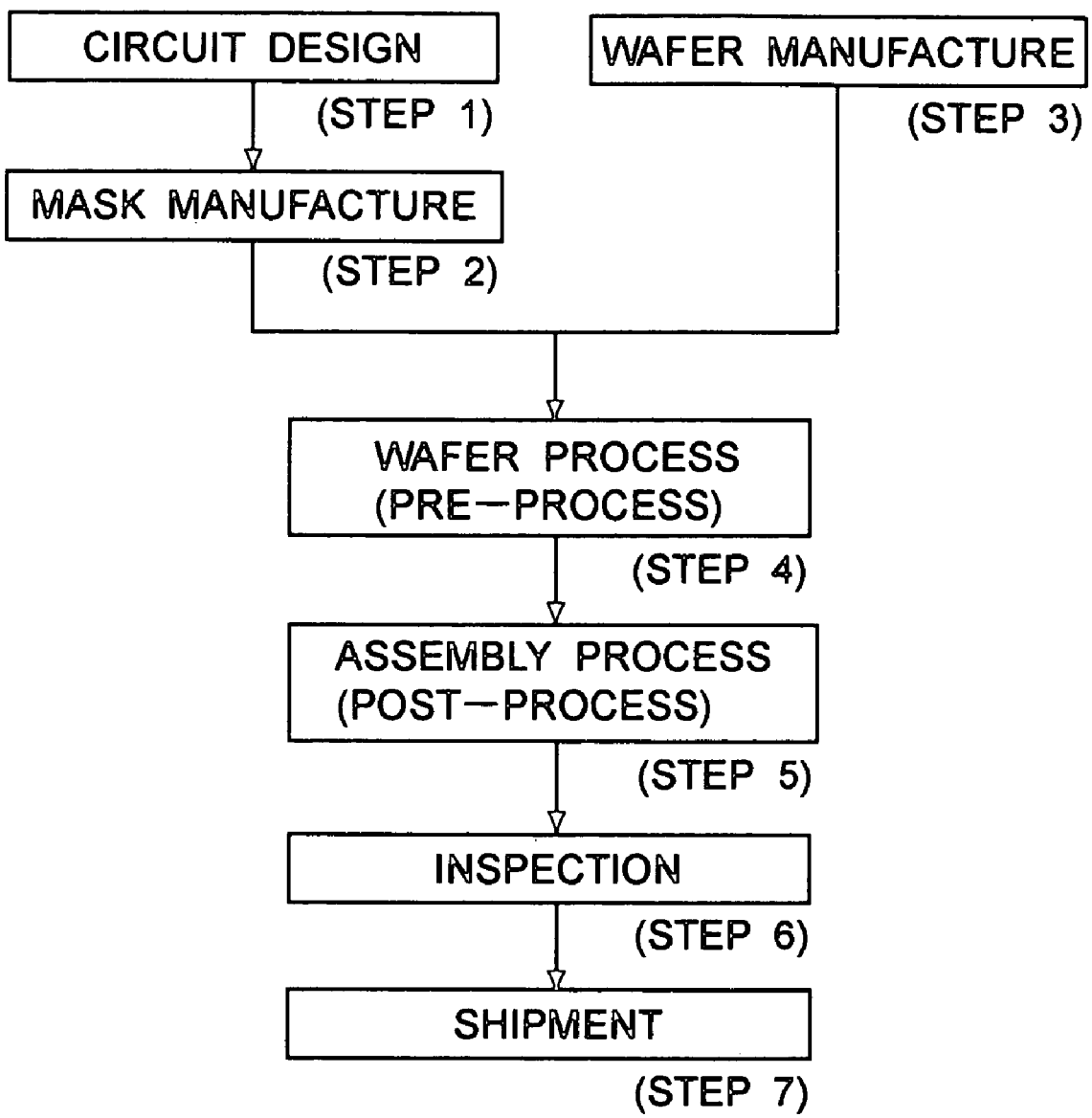
FIG. 4 is a flow chart for explaining the procedure of manufacture of devices such as semiconductor chips (e.g. IC or LSI), LCD or CCD, for example.

FIG. 4 is a flow chart for explaining the procedure of manufacturing various microdevices such as semiconductor chips (e.g., ICs or LSIs), liquid crystal panels, or CCDs, for example. In this embodiment, description will be made to an example of semiconductor chip production. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the thus prepared mask and wafer, a circuit is formed on the wafer in practice, in accordance with lithography. Step 5 subsequent to this is an assembling step which is called a post-process wherein the wafer having been processed at step 4 is formed into semiconductor chips. This step includes an assembling (dicing and bonding) process and a packaging (chip sealing) process. Step 6 is an inspection step wherein an operation check, a durability check an so on, for the semiconductor devices produced by step 5, are carried out. With these processes, semiconductor devices are produced, and they are shipped (step 7).

Figure 5:
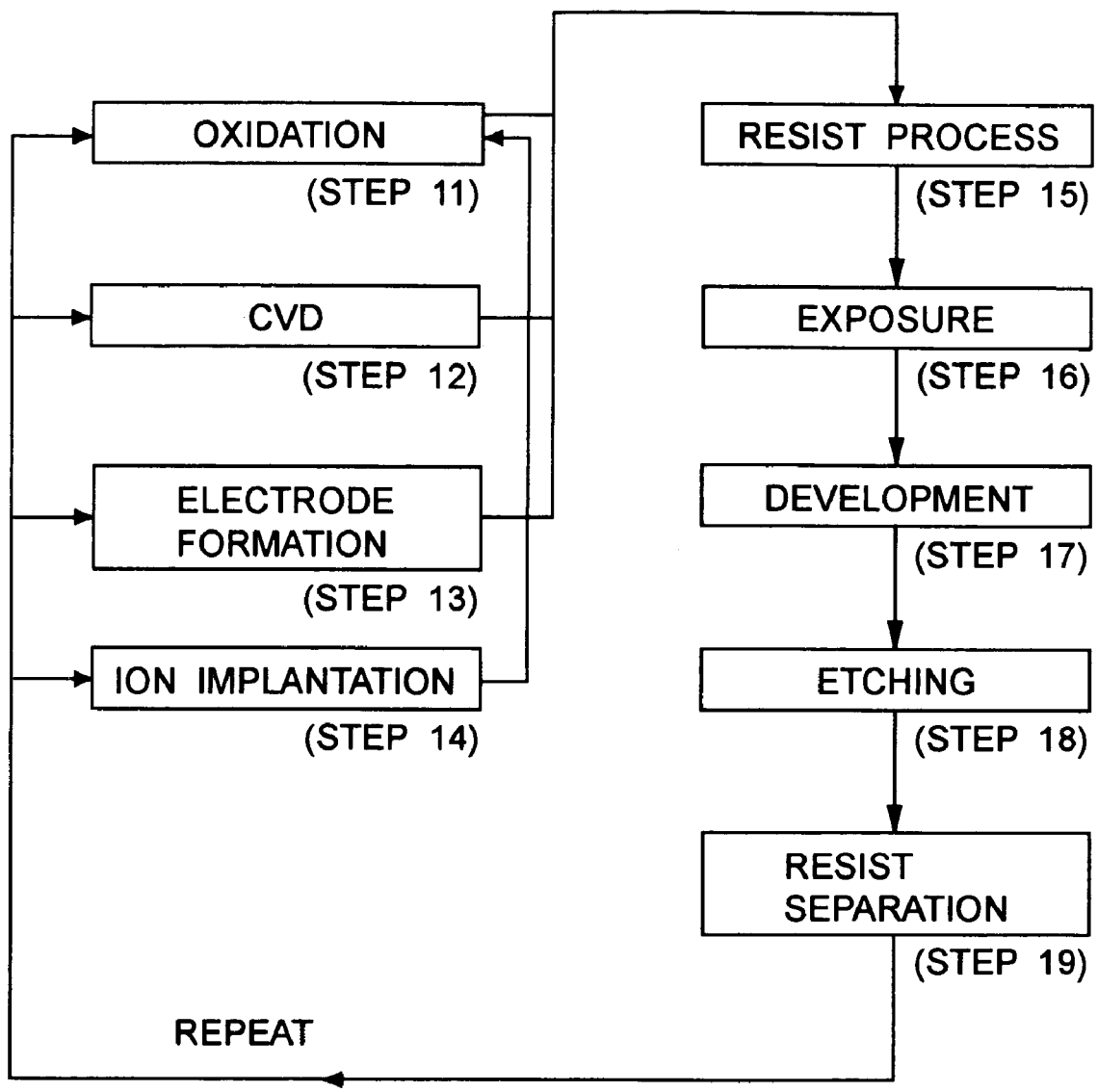
FIG. 5 is a flow chart for explaining details of a wafer process at step 4 in FIG. 4.

FIG. 5 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

In accordance with the device manufacturing method of this embodiment, high-quality microdevices can be manufactured. Thus, as described, a device manufacturing method that uses an exposure apparatus as well as a device as a product thereof are also in the scope of the present invention.

The present invention is not limited to the embodiments described above, and many modifications and deformations are possible within the scope of the invention.

In some aspects, the present invention can be summarized as exemplary forms, as follows.

[Item 1] An optical system for directing light from a light source to a predetermined plane, comprising: at least one optical element disposed in an inside space of said optical system; a measuring mechanism for measuring a surface shape of the at least one optical element; and a temperature controller for controlling a temperature of the at least one optical element on the basis of the measurement made by said measuring mechanism.

[Item 2] An optical system according to Item 1, wherein said measuring mechanism performs position measurement to a surface of the at least one optical element, at plural locations on that surface.

[Item 3] An exposure apparatus including an optical system as recited in Item 1.

[Item 4] A device manufacturing method, comprising the steps of: exposing an object to be exposed, by use of an exposure apparatus as recited in Item 3; and developing the exposed object.

[Item 5] An optical system for directing light from a light source to a predetermined plane, comprising: an optical element; a measuring mechanism for performing position measurement to a surface of the optical element, at plural measurement points on that surface; a first temperature controlling mechanism for controlling temperature of a first control region of the optical element; a second temperature controlling mechanism for controlling temperature of a second control region of the optical element; and a temperature controller for controlling said first and second temperature controlling mechanisms on the basis of the measurement made by said measuring mechanism.

[Item 6] An optical system according to Item 5, wherein the first control region is at a top or front face side of the optical element while the second control region is at a bottom or rear face side of the optical element.

[Item 7] An optical system according to Item 5, wherein both of the first and second control regions are at a bottom or rear face side of the optical element.

[Item 8] An optical system according to Item 5, wherein both of the first and second control regions are at a top or rear face side of the optical element.

[Item 9] An optical system according to Item 5, wherein the surface of the optical element is one of reflective surface, refractive surface and diffractive surface.

[Item 10] An optical system according to Item 5, wherein said temperature controller controls said first and second temperature controlling mechanisms so that, through application of a stress to the optical element, a result of measurement made by said measuring mechanism is held in a predetermined range.

[Item 11] An optical system according to Item 5, wherein said temperature controller controls said first and second temperature controlling mechanisms on the basis of the measurement made by said measuring mechanism, so that different temperatures are defined at the first and second control regions, respectively.

[Item 12] An optical system according to Item 5, wherein said measuring mechanism is operable to measure a shape of the surface of the optical element, with respect to two sections being approximately perpendicular to each other.

[Item 13] An optical system according to Item 12, wherein the two approximately perpendicular sections are approximately registered with a lengthwise direction and a widthwise direction of a predetermined region of the optical element which region is to be illuminated with light.

[Item 14] An optical system according to Item 13, wherein said temperature controller performs temperature control so as to reduce deformation of the optical element with respect to the two directions being approximately perpendicular to each other, to be measured by said measuring mechanism.

[Item 15] An optical system according to Item 5, wherein said temperature controller performs different temperature controls to the first and second control regions, respectively.

[Item 16] An optical system according to Item 5, wherein at least one of the plural measurement points is inside a predetermined region of the optical element which region is to be illuminated with light.

[Item 17] An optical system according to Item 5, wherein at least one of the plural measurement points is outside a predetermined region of the optical element which region is to be illuminated with light.

[Item 18] An optical system according to Item 5, wherein the plural measurement points are inside a predetermined region of the optical element which region is to be illuminated with light.

[Item 19] An optical system according to Item 5, wherein the plural measurement points are outside a predetermined region of the optical element which region is to be illuminated with light.

[Item 20] An optical system according to Item 5, wherein one of the plural measurement points is approximately at a center of a predetermined region of the optical element which region is to be illuminated with light.

[Item 21] An optical system according to Item 5, wherein said measuring mechanism performs position measurement to the surface of the optical element, at three or more measurement points on that surface.

[Item 22] An optical system according to Item 5, wherein the optical element has a linear expansion coefficient of not less than 0 ppb and not greater than 15 ppb.

[Item 23] An optical system according to Item 5, wherein the optical element has a linear expansion coefficient of not less than 0 ppb and not greater than 10 ppb.

[Item 24] An exposure apparatus including an optical system as recited in Item 5.

[Item 25] A device manufacturing method, comprising the steps of: exposing an object to be exposed, by use of an exposure apparatus as recited in Item 24; and developing the exposed object.

With the structure described hereinbefore, deformation of an optical element due to absorption of exposure light can be reduced, such that an optical system and an exposure apparatus in which aberration of optical performance is improved significantly are accomplished. Furthermore, since the shape of an exposure light irradiation region of the mirror that influences the optical performance is directly measured and deformation thereof is reduced, an exposure apparatus by which the aberration of optical performance can be corrected at much higher precision, is accomplished. Also, an exposure method by which deformation of an optical element due to absorption of exposure light is reduced and the aberration of optical performance is improved significantly, is accomplished.

Moreover, the effect of the device manufacturing method having a similar operation and function as the above-described exposure apparatus extends over a device itself which may be an intermediate or final result thereof. The device may include a semiconductor chip such as LSI or VLSI, a CCD, an LCD, a magnetic sensor and a thin film magnetic head, for example.

In accordance with the embodiments of the present invention as described above, an exposure apparatus and an exposure method by which a very fine linewidth can be transferred at a good precision, as compared with conventional method and apparatus. Further, in accordance with the present invention in an aspect thereof, higher quality devices can be produced.

While the invention has been described with reference to the structures disclosed herein, it is not confined to the details set forth and this application is intended to cover such modifications or changes as may come within the purposes of the improvements or the scope of the following claims.

What is claimed is:

1. An optical system for directing light from a light source to a predetermined plane, comprising:
   at least one optical element disposed in an inside space of said optical system;
   a measuring mechanism for measuring a surface shape of the at least one optical element;
   a temperature controlling mechanism disposed across from a region of the optical element for absorbing heat to cool the region; and
   a temperature controller for controlling the temperature controlling mechanism on the basis of the measurement made by said measuring mechanism.

2. An optical system according to claim 1, wherein said measuring mechanism performs position measurement to a surface of the at least one optical element, at plural locations on that surface.

3. An exposure apparatus including an optical system as recited in claim 1.

4. A device manufacturing method, comprising the steps of:
   exposing an object to be exposed, by use of an exposure apparatus as recited in claim 3; and
   developing the exposed object.

5. An optical system for directing light from a light source to a predetermined plane, comprising:
   an optical element;
   a measuring mechanism for performing position measurement to a surface of the optical element, at plural measurement points on that surface;
   a first temperature controlling mechanism for controlling temperature of a first control region of the optical element, the first temperature controlling mechanism being disposed across from the first control region of the optical element for absorbing heat to cool the region;
   a second temperature controlling mechanism for controlling temperature of a second control region of the optical element; and
   a temperature controller for controlling said first and second temperature controlling mechanisms on the basis of the measurement made by said measuring mechanism.

6. An optical system according to claim 5, wherein the first control region is at a top or front face side of the optical element while the second control region is at a bottom or rear face side of the optical element.

7. An optical system according to claim 5, wherein both of the first and second control regions are at a bottom or rear face side of the optical element.

8. An optical system according to claim 5, wherein both of the first and second control regions are at a top or rear face side of the optical element.

9. An optical system according to claim 5, wherein the surface of the optical element is one of reflective surface, refractive surface and diffractive surface.

10. An optical system according to claim 5, wherein said temperature controller controls said first and second temperature controlling mechanisms so that, through application of a stress to the optical element, a result of measurement made by said measuring mechanism is held in a predetermined range.

11. An optical system according to claim 5, wherein said temperature controller controls said first and second temperature controlling mechanisms on the basis of the measurement made by said measuring mechanism, so that different temperatures are defined at the first and second control regions, respectively.

12. An optical system according to claim 5, wherein said measuring mechanism is operable to measure a shape of the surface of the optical element, with respect to two sections being approximately perpendicular to each other.

13. An optical system according to claim 12, wherein the two approximately perpendicular sections are approximately registered with a lengthwise direction and a widthwise direction of a predetermined region of the optical element which region is to be illuminated with light.

14. An optical system according to claim 13, wherein said temperature controller performs temperature control so as to reduce deformation of the optical element with respect to the two directions being approximately perpendicular to each other, to be measured by said measuring mechanism.

15. An optical system according to claim 5, wherein said temperature controller performs different temperature controls to the first and second control regions, respectively.

16. An optical system according to claim 5, wherein at least one of the plural measurement points is inside a predetermined region of the optical element which region is to be illuminated with light.

17. An optical system according to claim 5, wherein at least one of the plural measurement points is outside a predetermined region of the optical element which region is to be illuminated with light.

18. An optical system according to claim 5, wherein the plural measurement points are inside a predetermined region of the optical element which region is to be illuminated with light.

19. An optical system according to claim 5, wherein the plural measurement points are outside a predetermined region of the optical element which region is to be illuminated with light.

20. An optical system according to claim 5, wherein one of the plural measurement points is approximately at a center of a predetermined region of the optical element which region is to be illuminated with light.

21. An optical system according to claim 5, wherein said measuring mechanism performs position measurement to the surface of the optical element, at three or more measurement points on that surface.

22. An optical system according to claim 5, wherein the optical element has a linear expansion coefficient of not less than 0 ppb and not greater than 15 ppb.

23. An optical system according to claim 5, wherein the optical element has a linear expansion coefficient of not less than 0 ppb and not greater than 10 ppb.

24. An exposure apparatus including an optical system as recited in claim 5.

25. A device manufacturing method, comprising the steps of:
   exposing an object to be exposed, by use of an exposure apparatus as recited in claim 24; and
   developing the exposed object.

* * * * *